United States Patent
Chang et al.

(10) Patent No.: US 7,243,047 B2
(45) Date of Patent: Jul. 10, 2007

(54) SYSTEM AND METHOD FOR MONITORING SMT APPARATUSES

(75) Inventors: Kuang-Yuan Chang, Shenzhen (CN); Hong-Liang Ding, Shenzhen (CN); Hui Wang, Shenzhen (CN); Wayne Shih, Shenzhen (CN); Ta-Yi Lin, Shenzhen (CN); Li-Xia Peng, Shenzhen (CN); Hui-Bing Li, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/307,913

(22) Filed: Feb. 28, 2006

(65) Prior Publication Data

US 2006/0265095 A1    Nov. 23, 2006

(30) Foreign Application Priority Data

May 6, 2005    (CN)    ................. 2005 1 0345686

(51) Int. Cl.
*G06F 11/30* (2006.01)
*G06F 19/00* (2006.01)

(52) U.S. Cl. .................... 702/184; 700/110
(58) Field of Classification Search ............ 702/184, 702/84, 182; 700/121, 109, 110; 705/22; 714/47; 257/E21.525
See application file for complete search history.

(56) References Cited

U.S. PATENT DOCUMENTS

| | | | |
|---|---|---|---|
| 5,109,269 A * | 4/1992 | Holzman | 257/700 |
| 5,822,210 A | 10/1998 | Kobayashi et al. | 700/121 |
| 7,003,477 B2 * | 2/2006 | Zarrow | 705/11 |
| 2005/0288812 A1 * | 12/2005 | Cheng et al. | 700/109 |

OTHER PUBLICATIONS

Feldmann et al., Yield Improvement in SMT Production by Integrated Process Monitoring and Testing, 1993 IEEE, pp. 229-234.*
Simon-Zanescu et al., Complex Evaluation of SMT Defects, 2004 IEEE, 27th Int'l Spring Seminar on Electronics Technology, pp. 53-57.*
Caswell, G., SMT Manufacturing Parameters and Their Impact on System Reliability, 1993 IEEE, pp. 211-216.*
Zhen et al., Quality Improvement Through SPC/DOE in SMT Manufacturing, 2000 IEEE, pp. 855-858.*

* cited by examiner

*Primary Examiner*—John Barlow
*Assistant Examiner*—Toan M. Le
(74) *Attorney, Agent, or Firm*—Wei Te Chung

(57) ABSTRACT

A method for monitoring surface mount technology (SMT) apparatuses includes the steps of: providing a data saving module for saving attribute data on the SMT apparatuses, the attribute data including maintenance parameters, repair parameters, and defect rate parameters; obtaining dynamic data on the SMT apparatuses in real time, the dynamic data including maintenance data, repair data, and defect rate data; and monitoring the SMT apparatuses by comparing the attribute data and the dynamic data on the SMT apparatuses.

19 Claims, 5 Drawing Sheets

US 7,243,047 B2

SYSTEM AND METHOD FOR MONITORING SMT APPARATUSES

FIELD OF THE INVENTION

The present invention relates to systems and methods for monitoring manufacturing apparatuses, and particularly to a system and method for monitoring surface mount technology (SMT) apparatuses.

DESCRIPTION OF RELATED ART

Due to the tremendous growth in the demand for electronic products and the requirement for quality, traditional manual soldering techniques are no longer sufficient for many or most electrical connections of a mass-produced article. Therefore, increasingly, electronic products are manufactured using SMT apparatuses. Accordingly, it is becoming more important to properly monitor numerous SMT apparatuses in a factory. Traditionally, engineers periodically observe and monitor the SMT apparatuses individually. However, these traditional means can be very inconvenient. In addition, randomly occurring problems on the SMT apparatuses may not be observed and dealt with promptly. Accordingly, the efficiency of the production line and the quality of products produced may both be unsatisfactory.

SUMMARY OF INVENTION

An exemplary embodiment of the present invention provides a system for monitoring surface mount technology (SMT) apparatuses. The system for monitoring an SMT apparatuses includes a data saving module, a data obtaining module and a system monitoring module. The data saving module is provided for saving attribute data including maintenance parameters, repair parameters, and defect rate parameters of the SMT apparatuses. The data obtaining module is provided for obtaining dynamic data including maintenance data, repair data, and defect rate data from the SMT apparatuses in real time. The system monitoring module includes a maintenance sub-module, a repair sub-module, and a defect rate sub-module. The maintenance sub-module is provided to determine whether the maintenance data meet the maintenance parameters, and for generating a maintenance instruction if not. The repair sub-module is provided to determine whether the repair data meet the repair parameters, and for generating a repair request if not. The defect rate sub-module is provided to determine whether the defect rate data meet the defect rate parameters, and for generating an alarm if not.

Another exemplary embodiment of the present invention provides a method for monitoring surface mount technology (SMT) apparatuses. The method includes the steps of: providing a data saving module for saving attribute data on an SMT apparatuses, the attribute data including maintenance parameters, repair parameters, and defect rate parameters; obtaining dynamic data on the SMT apparatuses in real time, the dynamic data including maintenance data, repair data, and defect rate data; comparing the maintenance data with the maintenance parameters in order to determine whether the maintenance data meet the maintenance parameters; generating a maintenance instruction if not; comparing the repair data with the repair parameters in order to determine whether the repair data meet the repair parameters; generating a repair request if not; comparing the defect rate data with the defect rate parameters in order to determine whether the defect rate data meet the defect rate parameters; and generating an alarm regarding the defect rate if not.

A further exemplary embodiment of the present invention provides another method for monitoring surface mount technology (SMT) apparatuses. The method includes the steps of: providing a data saving module for saving attribute data on an SMT apparatuses, the attribute data including maintenance parameters, repair parameters, and defect rate parameters; obtaining dynamic data on the SMT apparatuses in real time, the dynamic data including maintenance data, repair data, and defect rate data; and monitoring the SMT apparatuses by comparing the attribute data and the dynamic data on the SMT apparatuses.

With the system for monitoring SMT apparatuses, a computer can automatically monitor the SMT apparatuses, and random problems can be observed and dealt with promptly. This saves manpower and time. Therefore, the efficiency of production lines and the quality of goods produced can both be enhanced.

Other advantages and novel features will become more apparent from the following detailed description when taken in conjunction with the accompanying drawings, in which:

DETAILED DESCRIPTION

Figure 1:
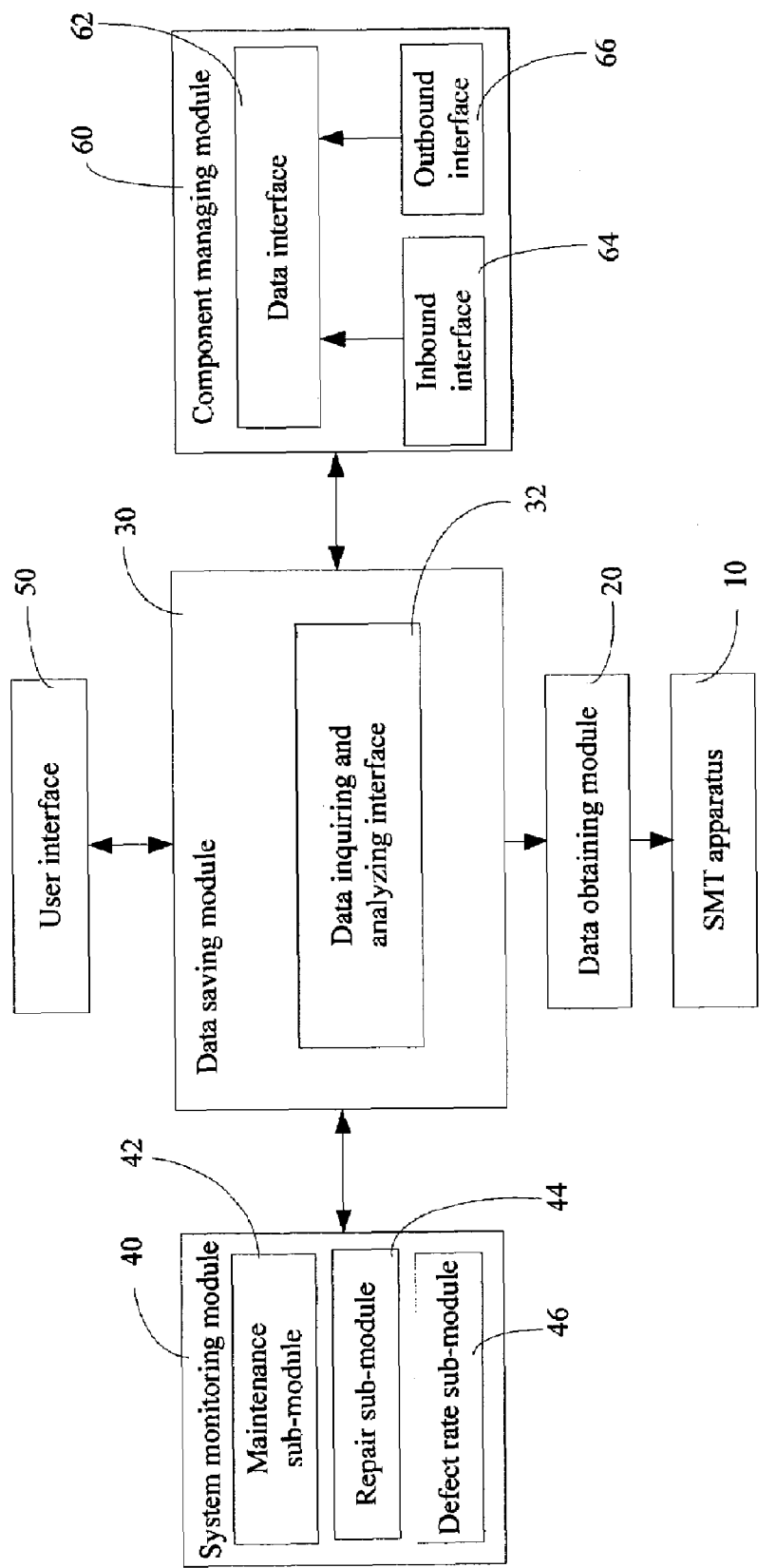
FIG. 1 is a block diagram of a system for monitoring SMT apparatuses of an exemplary embodiment of the present invention, together with one SMT apparatus.

FIG. 1 is a block diagram of a system for monitoring Surface Mount Technology (SMT) apparatuses of an exemplary embodiment of the present invention, together with one SMT apparatus. In the exemplary embodiment, the system for monitoring SMT apparatuses includes a data obtaining module 20, a data saving module 30, and a system monitoring module 40. The data obtaining module 20 is coupled to the SMT apparatuses 10 (only one shown). The data obtaining module 20 is provided for obtaining dynamic data from the SMT apparatuses 10 in real time, wherein the dynamic data includes maintenance data, repair data, and defect rate data, and for transmitting the dynamic data to the system monitoring module 40 via the data saving module 30. The data saving module 30 is provided for saving attribute data including maintenance parameters, repair parameters, and defect rate parameters of the SMT apparatuses 10. The data saving module 30 is also provided for saving the dynamic data obtained by the data obtaining module 20. The data saving module 30 includes a data inquiring and analyzing interface 32. The data inquiring and analyzing interface 32 is for providing file maintenance to the data saved in the data saving module 30, and for generating corresponding data reports on the SMT apparatuses 10. The data reports are made available for inquiries and analyzing. In the exemplary embodiment, the file maintenance includes adding, deleting, and inquiring.

The system monitoring module 40 is provided for monitoring the SMT apparatuses 10 based on the dynamic data and the attribute data, and includes a maintenance sub-module 42, a repair sub-module 44, and a defect rate sub-module 46. The maintenance sub-module 42 is provided for comparing the maintenance data with the maintenance parameters to determine whether the maintenance data meet the maintenance parameters. In the exemplary embodiment, if the maintenance data meet the maintenance parameters, the data saving module 30 saves the maintenance data; and if the maintenance data do not meet the maintenance parameters, the maintenance sub-module 42 generates a maintenance instruction.

The repair sub-module 44 is provided for comparing the repair data with the repair parameters to determine whether the repair data meet the repair parameters. In the exemplary embodiment, if the repair data meet the repair parameters, the data saving module 30 saves the repair data; and if the repair data do not meet the repair parameters, the repair sub-module 44 generates a repair request.

The defect rate sub-module 46 is provided for comparing the defect rate data with the defect rate parameters to determine whether the defect rate data meet the defect rate parameters. In the exemplary embodiment, if the defect rate data meet the defect rate parameters, the data saving module 30 saves the defect rate data; and if the defect rate data do not meet the defect rate parameters, the defect rate sub-module 46 generates a system alarm.

In the exemplary embodiment, the system for monitoring SMT apparatuses further includes a user interface 50. The user interface 50 is provided for displaying the maintenance instruction, the repair request, and the system alarm.

In the exemplary embodiment, the system for monitoring SMT apparatuses further includes a component managing module 60. The component managing module 60 is provided for managing stock information on the SMT apparatuses 10, and generating an alarm when a stock of any component of the SMT apparatuses 10 is less than a corresponding predefined threshold level. The system monitoring module 40 can inquire about component stock levels via the data saving module 30. The component managing module 60 includes a data interface 62, an inbound interface 64, and an outbound interface 66. The data interface 62 is for providing an inquiry function for inquiring about and generating reports on the component stock levels. The inbound interface 64 is provided for recording data on inbound components and accordingly updating the component stock levels. The outbound interface 66 is provided for recording data on outbound components and accordingly updating the component stock levels. In the exemplary embodiment, the threshold levels are set by users via the user interface 50 and the data saving module 30, and are used by the component managing module 60. When the stock level of any component is less than the corresponding threshold level, the component managing module 60 can automatically generate a system alarm regarding the component stock level, and send the alarm to the user interface 50 via the data saving module 30.

Figure 2:
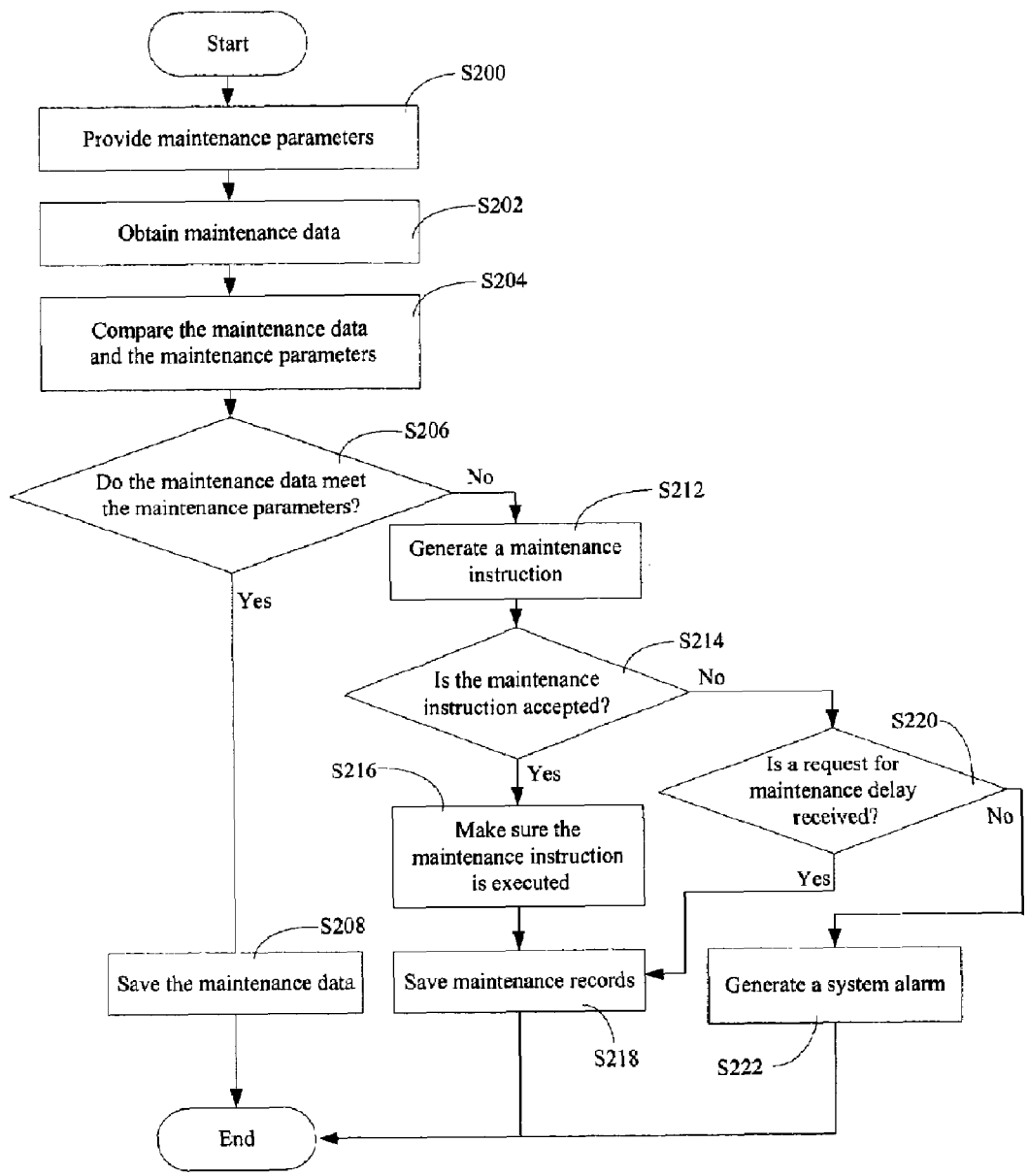
FIG. 2 is a flowchart of an exemplary maintenance procedure using the system of FIG. 1.

FIG. 2 is a flowchart illustrating a maintenance procedure of the system for monitoring SMT apparatuses of an exemplary embodiment of the present invention. At step S200, the data saving module 30 provides maintenance parameters. At step S202, the data obtaining module 20 obtains maintenance data from the SMT apparatuses 10, and transmits the maintenance data to the maintenance sub-module 42 via the data saving module 30. At step S204, the maintenance sub-module 42 receives the maintenance data, and compares the maintenance data with the maintenance parameters. At step S206, the maintenance sub-module 42 determines whether the maintenance data meet the maintenance parameters. If the maintenance data meet the maintenance parameters, at step S208, the data saving module 30 saves the maintenance data. If the maintenance data do not meet the maintenance parameters, at step S212, the maintenance sub-module 42 generates a maintenance instruction, and transmits the maintenance instruction to the user interface 50 via the data saving module 30.

At step S214, the maintenance monitoring sub-module 42 determines whether the maintenance instruction is accepted by a user via the user interface 50. If the maintenance instruction is accepted, at step S216, the maintenance sub-module 42 monitors and makes sure the maintenance instruction is executed by the user. Then at step 218, the data saving module 30 saves maintenance records. If the maintenance instruction is not accepted, at step S220, the maintenance sub-module 42 determines whether a request for a maintenance delay is received from the user interface 50. If so, at step S218, the data saving module 30 saves the request. If not, at step S222, the maintenance sub-module 42 generates a system alarm, and sends the alarm to the user interface 50 via the data saving module 30.

Figure 3:
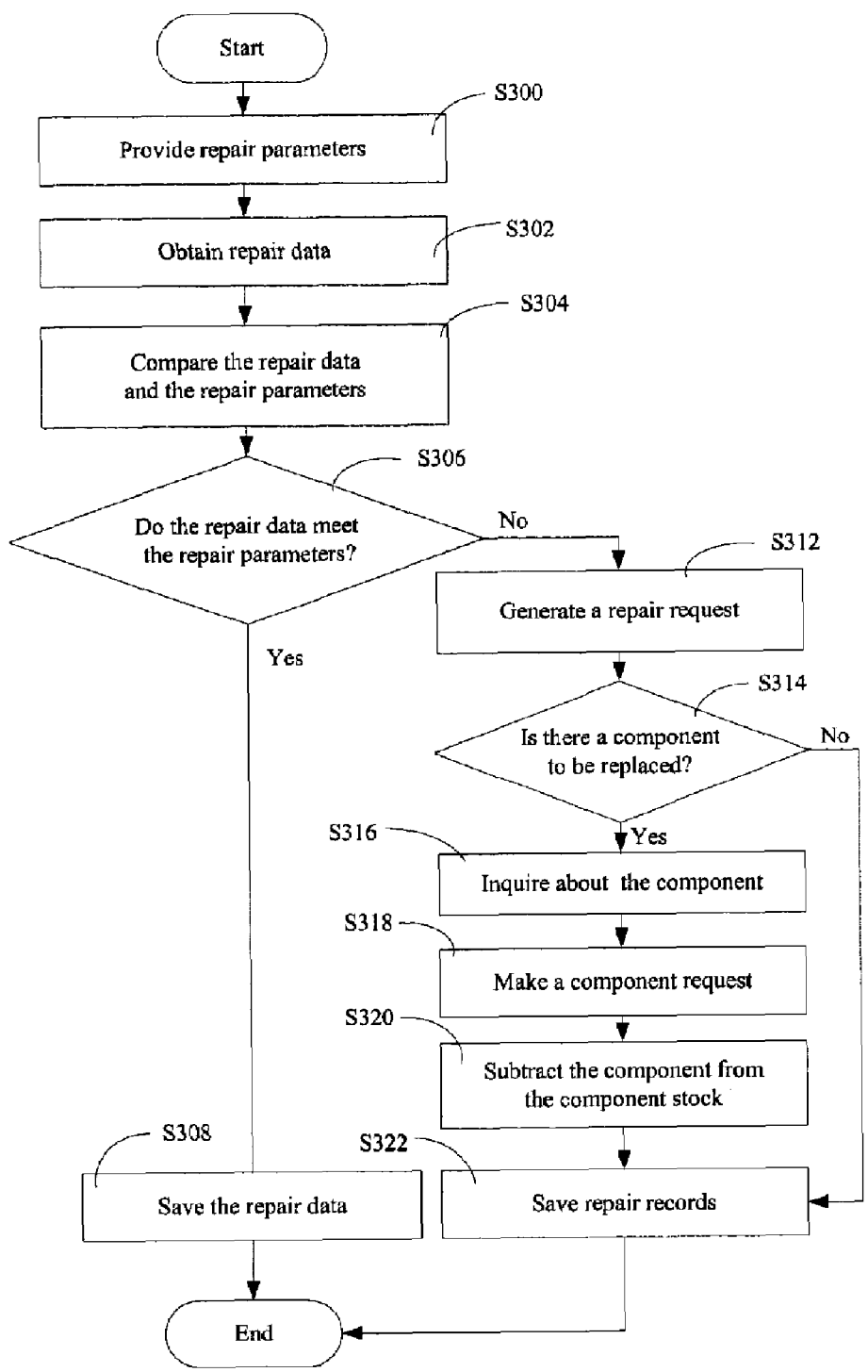
FIG. 3 is a flowchart of an exemplary repair procedure using the system of FIG. 1.

FIG. 3 is a flowchart illustrating a repair procedure of the system for monitoring SMT apparatuses of an exemplary embodiment of the invention. At step S300, the data saving module 30 provides repair parameters. At step S302, the data obtaining module 20 obtains repair data from the SMT apparatuses 10, and transmits the repair data to the repair sub-module 44 via the data saving module 30. At step S304, the repair sub-module 44 receives the repair data, and compares the repair data with the repair parameters. At step S306, the repair sub-module 44 determines whether the repair data meet the repair parameters. If the repair data meet the repair parameters, at step S308, the data saving module 30 saves the repair data. If the repair data do not meet the repair parameters, at step S312, the repair sub-module 44 generates a repair request.

At step S314, the repair sub-module 44 determines whether there is a component of the SMT apparatuses 10 to be replaced according to the repair request. If there is no component to be replaced, at step S322, the data saving module 30 saves repair records. If there is a component to be replaced, at step S316, the repair sub-module 44 inquires about the availability of the component from the component managing module 60 via the data saving module 30. Then at step S318, the repair sub-module 44 requests a component. After the component is removed from stock by an operator, at step S320, the component managing module 60 automatically subtracts the removed component from the component stock level of the component managing module 60. Then at step S322, the data saving module 30 saves repair records.

Figure 4:
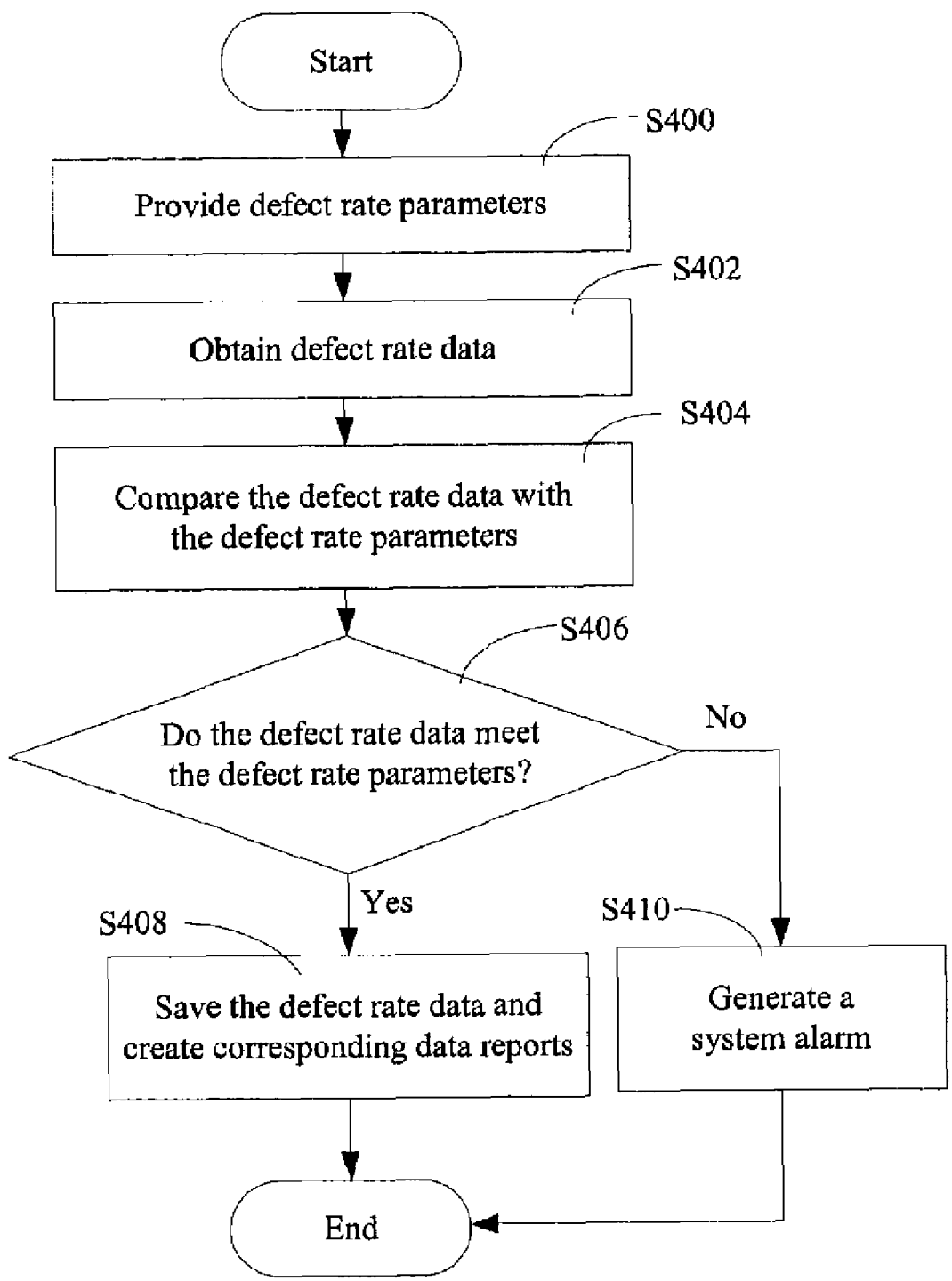
FIG. 4 is a flowchart of an exemplary defect rate monitoring procedure using the system of FIG. 1.

FIG. 4 is a flowchart illustrating a defect rate monitoring procedure of the system for monitoring SMT apparatuses of an exemplary embodiment of the invention. At step S400, the data saving module 30 provides defect rate parameters. At step S402, the data obtaining module 20 obtains defect rate data from the SMT apparatuses 10, and transmits the defect rate data to the defect rate sub-module 46 via the data saving module 30. At step S404, the defect rate sub-module 46 receives the defect rate data, and compares the defect rate data with the defect rate parameters. At step S406, the defect rate sub-module 46 determines whether the defect rate data meet the defect rate parameters. If the defect rate data meet the defect rate parameters, at step S408, the data saving module 30 saves the defect rate data, and generates corresponding data reports on the defect rate. If the defect rate data do not meet the defect rate parameters, at step S410, the defect rate sub-module 46 generates a system alarm, and sends the alarm to the user interface 50 via the data saving module 30.

Figure 5:
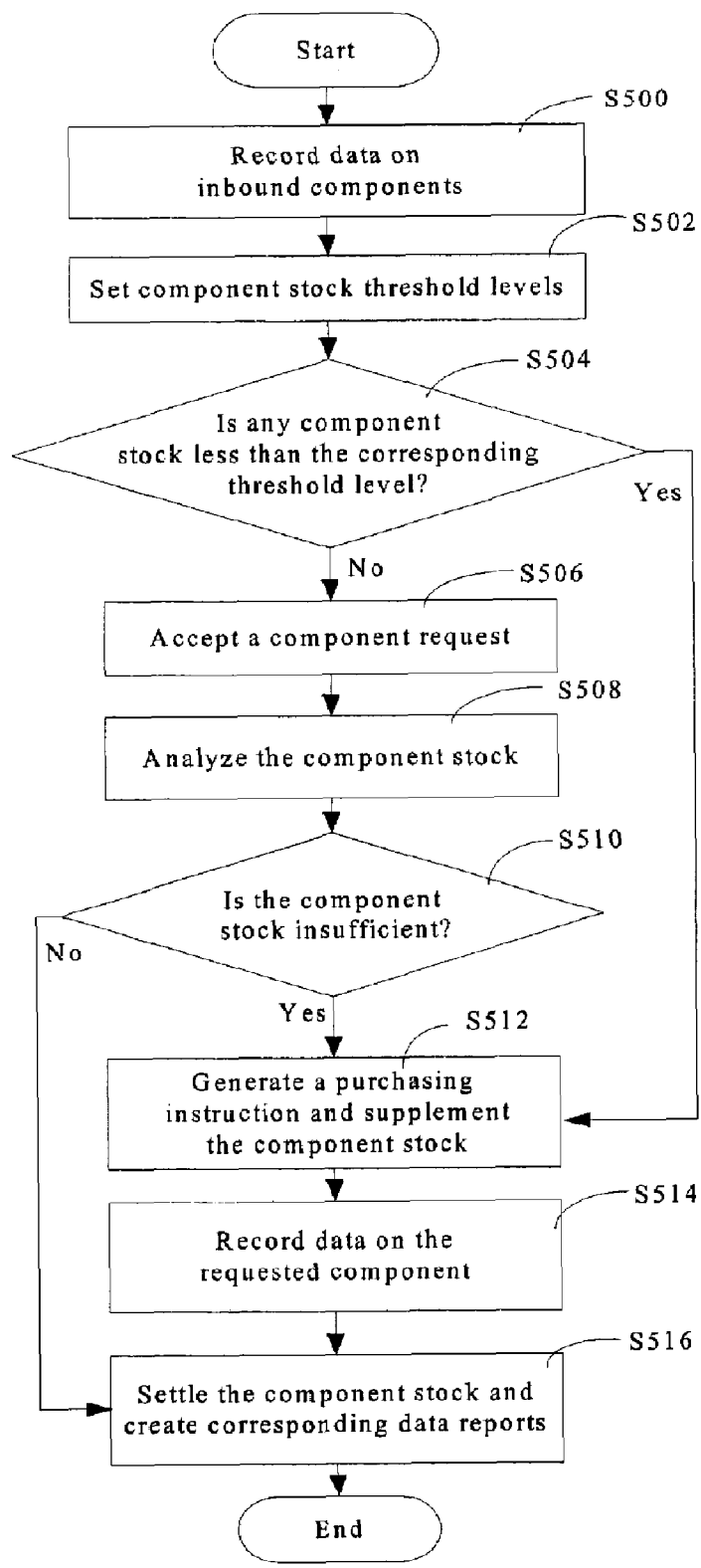
FIG. 5 is a flowchart of an exemplary component managing procedure using the system of FIG. 1.

FIG. 5 is a flowchart illustrating a component managing procedure of the system for monitoring SMT apparatuses of an exemplary embodiment of the invention. At step S500, the inbound interface 62 records data on inbound components added to stock. At step S502, the component stock threshold levels are set by users via the user interface 50 and the data saving module 30. The threshold levels can be used by the component managing module 60. At step S504, the component managing module 60 determines whether any component stock level is less than the corresponding threshold level. If so, the procedure proceeds to step S512 described below. If not, at step S506, the component managing module 60 accepts a component request from the repair sub-module 44 via the data saving module 30. At step S508, the component managing module 60 analyzes the component stock level according to the component request. At step S510, the component managing module 60 determines whether the component stock level is sufficient. If the component stock level is sufficient, the procedure proceeds to step S516 described below. If the component stock level is insufficient, the procedure proceeds to step S512 described below.

At step S512, the component managing module 60 generates a purchasing instruction, and accordingly the component stock is restocked by an operator. At step S514, the outbound interface 66 records data on the requested component after the requested component is taken away for use. Then the procedure proceeds to step S516 described below.

In the last step S516, the component managing module 60 settles the accounting of the component stock, and generates corresponding data reports.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

What is claimed is:

1. A system for monitoring surface mount technology (SMT) apparatuses, comprising:
    a data saving module for saving attribute data comprising maintenance parameters, repair parameters and defect rate parameters of the SMT apparatuses;
    a data obtaining module for obtaining dynamic data comprising maintenance data, repair data, and defect rate data from the SMT apparatuses in real time; and
    a system monitoring module for monitoring the SMT apparatuses based on the dynamic data and the attribute data, the system monitoring module comprising:
    a maintenance sub-module for comparing the maintenance data with the maintenance parameters to determine whether the maintenance data meet the maintenance parameters, and for generating a maintenance instruction if the maintenance data do not meet the maintenance parameters;
    a repair sub-module for comparing the repair data with the repair parameters to determine whether the repair data meet the repair parameters and for generating a repair request if the repair data do not meet the repair parameters; and
    a defect rate sub-module for comparing the defect rate data with the defect rate parameters to determine whether the defect rate data meet the defect rate parameters, and for generating an alarm if the defect rate data do not meet the defect rate parameters.

2. The system as claimed in claim 1, further comprising a user interface for displaying the maintenance instruction, the repair request, and the alarm.

3. The system as claimed in claim 1, further comprising a component managing module for managing information on stock levels of components for the SMT apparatuses, and for generating an alarm when any stock level of the SMT apparatuses is less than a corresponding threshold level.

4. The system as claimed in claim 3, wherein the component managing module comprises a data interface for providing an inquiring function for inquiring about any of the component stock levels and generating one or more data reports on any of the component stock levels.

5. The system as claimed in claim 3, wherein the component managing module comprises an inbound interface for recording data on restocking of the components and accordingly updating the component stock levels.

6. The system as claimed in claim 3, wherein the component managing module comprises an outbound interface for recording data on any one or more components removed from stock and accordingly updating one or more corresponding component stock levels.

7. The system as claimed in claim 1, wherein the data saving module comprises a data inquiring and analyzing interface for providing file maintenance to the data saved in the data saving module, and for generating one or more corresponding data reports on the SMT apparatuses for inquiry and analysis.

8. The system as claimed in claim 7, wherein the file maintenance comprises adding, deleting, and inquiring.

9. A method for monitoring surface mount technology (SMT) apparatuses, comprising the steps of:
    providing a data saving module for saving attribute data on the SMT apparatuses, the attribute data comprising maintenance parameters, repair parameters, and defect rate parameters;
    obtaining dynamic data on the SMT apparatuses in real time, the dynamic data comprising maintenance data, repair data, and defect rate data;
    comparing the maintenance data with the maintenance parameters in order to determine whether the maintenance data meet the maintenance parameters;
    generating a maintenance instruction if the maintenance data do not meet the maintenance parameters;
    comparing the repair data with the repair parameters in order to determine whether the repair data meet the repair parameters;
    generating a repair request if the repair data do not meet the repair parameters; comparing the defect rate data with the defect rate parameters in order to determine whether the defect rate data meet the defect rate parameters; and
    generating an alarm regarding the defect rate if the defect rate data do not meet the defect rate parameters.

10. The method as claimed in claim 9, further comprising the step of displaying any one of more of the maintenance instruction, the repair request, and the alarm.

11. A method for monitoring surface mount technology (SMT) apparatuses, comprising the steps of:
    providing a data saving module for saving attribute data on the SMT apparatuses, the attribute data comprising maintenance parameters, repair parameters, and defect rate parameters;

obtaining dynamic data on the SMT apparatuses in real time, the dynamic data comprising maintenance data, repair data, and defect rate data; and monitoring the SMT apparatuses by comparing the attribute data and the dynamic data on the SMT apparatuses.

12. The method as claimed in claim 11, wherein the monitoring step comprises the steps of:

comparing the maintenance data with the maintenance parameters in order to determine whether the maintenance data meet the maintenance parameters; and generating a maintenance instruction if the maintenance data do not meet the maintenance parameters.

13. The method as claimed in claim 12, wherein the monitoring step further comprises the steps of:

determining whether the maintenance instruction is accepted; and making sure the maintenance instruction is executed, if the maintenance instruction is accepted; and saving maintenance records.

14. The method as claimed in claim 13, wherein the monitoring step further comprises the steps of:

determining whether a request for maintenance delay is received, if the maintenance instruction is not accepted; and saving the request if the request is received; or generating an alarm regarding maintenance if the request is not received.

15. The method as claimed in claim 12, wherein the monitoring step further comprises the steps of:

comparing the repair data with the repair parameters in order to determine whether the repair data meet the repair parameters; and generating a repair request if the repair data do not meet the repair parameters.

16. The method as claimed in claim 15, wherein the monitoring step further comprises the steps of:

determining whether there is a component to be replaced according to the repair request;

inquiring whether the component is in stock, if there is a component to be replaced;

making a component request;

subtracting the component from a component stock level after the component is taken away for use; and saving a repair record.

17. The method as claimed in claim 16, wherein the monitoring step further comprises the step of saving a repair record if there is no component to be replaced.

18. The method as claimed in claim 15, wherein the monitoring step further comprises the steps of:

comparing the defect rate data with the defect parameters in order to determine whether the defect rate data meet the defect rate parameters; and generating an alarm regarding the defect rate if the defect rate data do not meet the defect rate parameters.

19. The method as claimed in claim 18, wherein the monitoring step further comprises the step of displaying any one of more of the maintenance instruction, the repair request, and the alarm.

* * * * *